United States Patent [19]

Weimer

[11] 4,134,031
[45] Jan. 9, 1979

[54] CHARGE INJECTION DEVICES AND ARRAYS AND SYSTEMS INCLUDING SUCH DEVICES

[75] Inventor: Paul K. Weimer, Princeton, N.J.

[73] Assignee: RCA Corporation, New York, N.Y.

[21] Appl. No.: 834,270

[22] Filed: Sep. 19, 1977

[51] Int. Cl.² .................. H03K 3/42; H01L 29/78; H01L 27/14; H01L 31/00
[52] U.S. Cl. ............................ 307/311; 357/24; 357/30; 250/211 J
[58] Field of Search ............. 357/24, 30; 307/221 D, 307/311; 250/211 J

[56] References Cited

U.S. PATENT DOCUMENTS

| | | | |
|---|---|---|---|
| 3,906,544 | 9/1975 | Engeler et al. | 357/24 |
| 3,935,446 | 1/1976 | Michon | 357/24 |
| 3,983,395 | 9/1976 | Kim | 357/24 |
| 4,000,418 | 12/1976 | Waldron et al. | 357/24 |
| 4,011,441 | 3/1977 | Michon et al. | 357/24 |
| 4,016,550 | 4/1977 | Weimer | 357/24 |
| 4,032,903 | 6/1977 | Weimer | 357/24 |
| 4,055,836 | 10/1977 | Weimer | 357/24 |

OTHER PUBLICATIONS

Sequin et al., *Charge Transfer Devices* Academic Press, N.Y. (7/75) pp. 42-45.
Burke et al., "Charge-Injection Imaging; Operating Techniques and Performances Characteristics" IEEE Trans. on Electron Devices, vol. ED-23 (2/76) pp. 189-196.
Sachs et al., "Solid State Imaging Systems" Electro-Optical Systems Design (10/75) pp. 84-88.

*Primary Examiner*—William D. Larkins
*Assistant Examiner*—Gene M. Munson
*Attorney, Agent, or Firm*—H. Christoffersen; Samuel Cohen

[57] ABSTRACT

A charge injection device (CID) structure comprising two conductors for forming two adjacent potential wells in a semiconductor substrate and means such as an ion implanted region for maintaining a potential barrier between these wells. The CID is operated in such a way as to permit more of the charge accumulated during the integration time in response to a given voltage applied to the conductors to be useful in producing a readout signal than in previous CID's. Also, the structure and mode of operation are such as to lessen undesired capacitive coupling effects.

13 Claims, 12 Drawing Figures

LEGEND
⊠ = MEANS PRODUCING POTENTIAL BARRIER

CHARGE INJECTION DEVICES AND ARRAYS AND SYSTEMS INCLUDING SUCH DEVICES

The present invention relates generally to charge injection devices (CID's) such as employed in image sensing arrays.

Figure 1:
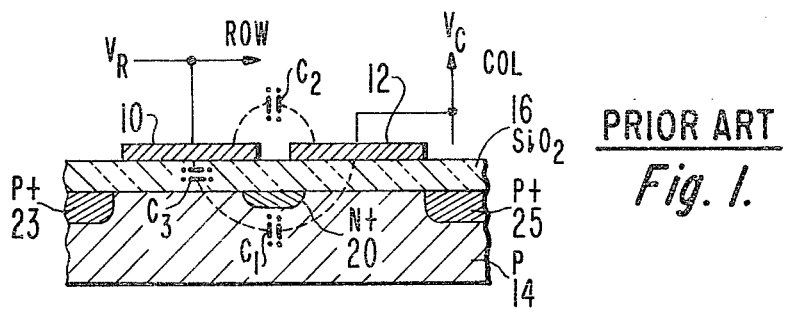
FIG. 1 is a cross-sectional view of a known CID.

The known CID shown in FIG. 1 is described by H. K. Burke and G. J. Michon in the article "Charge-Injection Imaging: Operating Techniques and Performance Characteristics," *IEEE Trans. on El. Dev., Vol. ED*-23, No. 2, p. 189, February 1976, and elsewhere in the literature. The CID includes a semiconductor substrate 14, an insulating layer 16, such as one formed of silicon dioxide, on the substrate surface and two conductors 10 and 12 over the insulation. Here and in the remaining figures the substrate will be shown as P-type silicon, it being understood that it may instead be N-type with suitable changes in operating voltage polarity, channel stop type and so on. The conductor 10 may be connected to or be part of a row lead and the conductor 12 may be connected to or be part of a column lead when the CID is an element of a large image-sensing array. An N+ region 20, which may be a diffusion in the substrate, is located beneath the edges of both conductors 10 and 12. P+ regions 23 and 25 comprise channel stops for defining the boundaries of the CID location.

Figure 2:
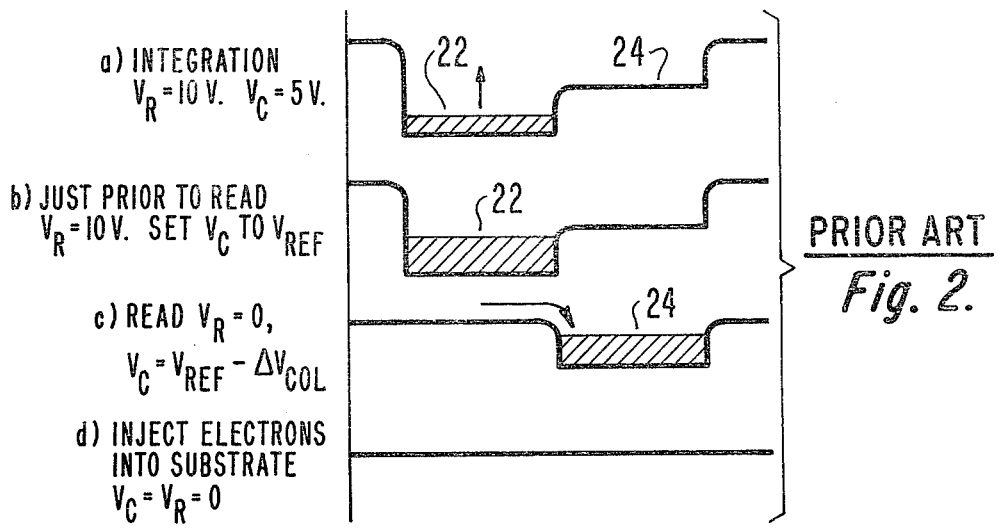
FIG. 2 is a drawing of surface potential profiles obtained during the operation of the CID of FIG. 1.

The operation of the CID is depicted in FIG. 2. Initially the row and column conductors may be held at a relatively negative potential, actually ground level in this illustration, in order to "inject" into the substrate any electrons which may be present at the substrate surfaces beneath conductors 10 and 12. Then the row voltage $V_R$ may be placed at ten volts and the column voltage may be cycled between zero and five volts during the time a light image is projected onto the substrate as shown at a. For purposes of the present discussion, the light image may be considered to be projected onto the substrate surface through transparent or semi-transparent conductors 10 and 12, such as conductors formed of polysilicon. Alternatively, the substrate may be thinned and the image projected thereon through the back surface of the substrate. During the integration time, photo induced minority charge carriers (electrons in this example) accumulate in the potential well 22 beneath conductor 10. This potential well is deeper than the potential well 24 beneath conductor 12 so that any electrons which are photogenerated at 24 will travel to well 22.

Just prior to readout, the column voltage $V_c$ is set to a reference level $V_{REF}$ and is permitted to float at this level. The reference voltage for each column is a particular value (in the neighborhood of 5 volts) which will allow the output circuit to measure most accurately the change in column voltage during the later "read" step when the photo-electrons are transferred to or from the column capacitor. Copending U.S. application Ser. No. 718,075 for "Charge Transfer Readout Circuits," filed Aug. 26, 1976 by the present inventor and assigned to the same assignee as the present application, describes a preferred arrangement for accurately resetting the column voltages to a reference level; however, other alternatives may be used instead. Thereafter, the row voltage $V_R$ is changed to zero to reduce the depth of potential well 22 so that the electrons formerly present in this well flow into well 24 as shown at c in FIG. 2. The result of the flow of electrons to the potential well 24 is to reduce the column voltage $V_c$ by an amount $\Delta V_{COL}$, where $\Delta V_{COL}$ is proportional to the number of electrons which have accumulated during the integration time and have subsequently been transferred into well 24. This change in voltage level may be sensed by a sense amplifier connected to a column conductor. A more detailed description of a CID system employing one form of readout may be found in U.S. Pat. No. 4,016,550 for "Charge Transfer Readout of Charge Injection Device Arrays," issued Apr. 5, 1977 to the present inventor; however, alternatives described elsewhere in the literature may be used instead.

There are capacitive coupling effects which are present in the CID illustrated which adversely affect the performance of the CID. One such effect is due to the capacitance $C_1$ from the substrate surface beneath one of the conductors 10 to the other conductor 12. During the transfer of electrons from well 22 to well 24 it already has been stated that the signal produced is proportional to the number of such electrons and this, in turn, is proportional to the light intensity. However, when the row voltage $V_R$ changes from +10 volts to 0 volts in order to cause the transfer of electrons from well 22 to well 24, a portion of this voltage is coupled from conductor 10 to conductor 12 via the capacitances $C_3$ and $C_1$. The portion $\Delta V_S$ of the change in the row voltage $V_R$ which is transferred to the column lead is proportional to the difference between the surface potential $V_{S10}$ beneath conductor 10 prior to transfer of charge to beneath the column conductor 12 and the surface potential $V_{S10}$ after $V_R$ has been reduced to zero. The surface potential $V_{S10}$, prior to transfer, is dependent on the number of electrons which have accumulated at the surface. Surface potential $V_{S10}$ prior to transfer becomes less positive as more and more electrons accumulate. In other words, $\Delta V_{S10}$ is inversely proportional to the light reaching the substrate so that $\Delta V_S$ is also inversely proportional to the light intensity. Therefore, the voltage transferred through capacitance $C_1$ during the read step (shown in c of FIG. 2) is opposite in sign to the signal voltage (electrons) transferred from beneath conductor 10 to beneath conductor 12 (from well 22 to well 24) during step c and thus tends to subtract from the signal induced on the column lead, that is, the presence of $C_1$ reduces the signal level $\Delta V_{COL}$.

There is also direct coupling via distributed capacitance $C_2$ from one conductor 10 to the other 12. Although this direct coupling between the row and column conductors via capacitance $C_2$ does not affect the light transfer characteristic, it can produce a background signal which is as large as the light signal. If this background signal is not at the same level at all locations in a CID array, this operates as a source of fixed pattern noise. In practice, it is found that this direct coupling turns out not to be uniform for a number of reasons. One is that the capacitances $C_2$ sometimes are not identical from one location to another and another is that the row pulses are not necessarily identical from one row to the next.

Figure 3:
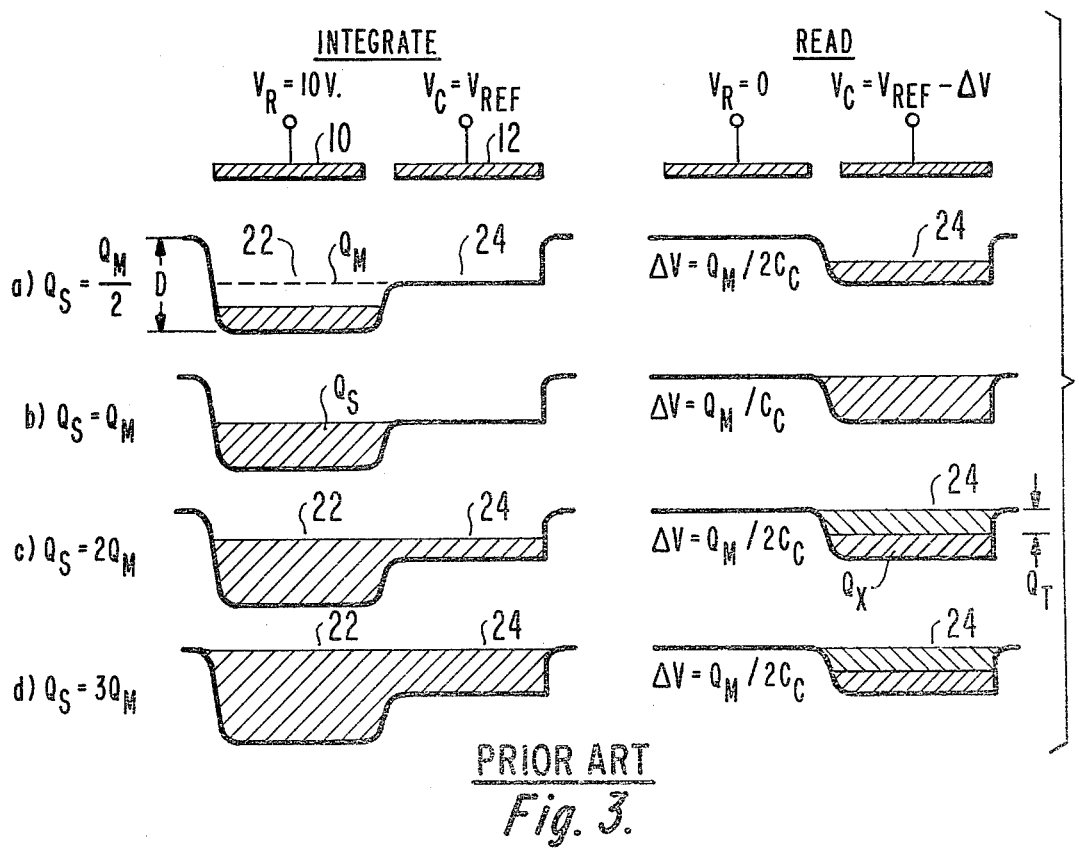
FIG. 3 is another drawing of surface potential profiles to illustrate some shortcomings in the performance of the CID of FIG. 1.

FIG. 3 illustrates another limitation on the performance of the CID of FIG. 1 in the mode of operation described in the above-identified Burke et al. article. The left column in FIG. 3 illustrates the charges collected during the integration time and the right column illustrates the charge transferred from well 22 to well 24 during the read time. The dashed line $Q_M$, aligned with the surface potential $V_{S12}$, represents the maximum "useful" charge, for reasons which will become clear shortly, even though the two wells 22 and 24 together actually can store $3Q_M$. It is assumed throughout that just before the read period illustrated on the right that the column potential $V_c$ has been temporarily dropped to zero volts to inject the accumulated charges of the preceding row after its readout.

FIG. 3 illustrates at a a light level such that the actual charge $Q_S$ accumulated during the integration time is $Q_M/2$. During the read interval, when this charge transfers to well 24, it fills well 24 to one half its capacity. In response to the transfer of the charge, the voltage $V_c$ changes from $V_{REF}$ to $V_{REF}-\Delta V$ where in this example $\Delta V = Q_S/C_C = Q_M/2C_C$ where $C_C$ is assumed to be the column capacitance. For purposes of the present discussion, all other capacitances which would tend to lessen $\Delta V$ are ignored.

FIG. 3 illustrates at b the same thing as above but at a higher light level. Now the charge $Q_S$ accumulated is equal to $Q_M$. It can be seen that the $\Delta V$ induced during the read interval is equal to $Q_M/C_C$, that is, it is double what it was in example a and this is, of course, expected.

However, at greater light levels than shown at b, the signal level $\Delta V$ begins to decrease rather than increase. FIG. 3c illustrates the case for a light level twice that of example b and it causes the accumulation of charge $Q_S = 2Q_M$. A portion of this charge $Q_X$ overflows well 22 during the integration time and becomes stored in well 24. Although this overflow charge $Q_X$ is temporarily returned to the row well during column injection, that is, when the column voltage is reduced to inject the previous row of CID's, it flows back to the column well before readout when the column voltage is returned to its original value. Now during the transfer of electrons when $V_R$ changes to 0, the well 24 can receive only one half well of charge as shown at $Q_T$ because the well already was half full with the charge $Q_X$. Note that in this example, $Q_X = Q_M/2$ and $Q_T = Q_X$. The remainder of the charge (an amount equal to $Q_M$) becomes injected into the substrate and does not create any useful signal. Since well 24 only receives one half well of charge $Q_T$, the signal voltage produced is $\Delta V = Q_M/2C_C$.

In the last case, illustrated at d in FIG. 3, the light level is still higher and both wells 22 and 24 are filled to capacity ($Q_S = 3Q_M$). Now after the column is injected prior to read, the charge remaining in the full row redistributes itself between the two wells, filling each to the same level illustrated in FIG. 3c where $Q_S = 2Q_M$. The resulting output signal is again $\Delta V = Q_M/2C_C$, and the output signals for still higher light levels remain at this reduced value.

The signal decrease shown at c and d of FIG. 3 can be avoided by operating the complete system in another way (not described in the above-identified Burke et al. article). In this other way rather than reading during the period illustrated in FIG. 3, one can sense for a change in $V_{REF}$ when transferring the electrons from well 24 back to well 22. This can be done by changing $V_R$ from 0 to 10 volts after the electrons are present in well 24. The transfer of electrons from well 24 to well 22 manifests itself as an increase $+\Delta V$ in the voltage $V_c$ on the column conductor. However, even in this mode of operation, note that for an integration voltage of 10 volts, which creates a potential well having a depth D, the amount of charge accumulated which may be used to produce a useful output signal is proportional not to D but rather to D/2. Thus, the charge collection capacity which is available, (and therefore the amount of light which can be integrated in a given time) is relatively limited.

Figure 4A:
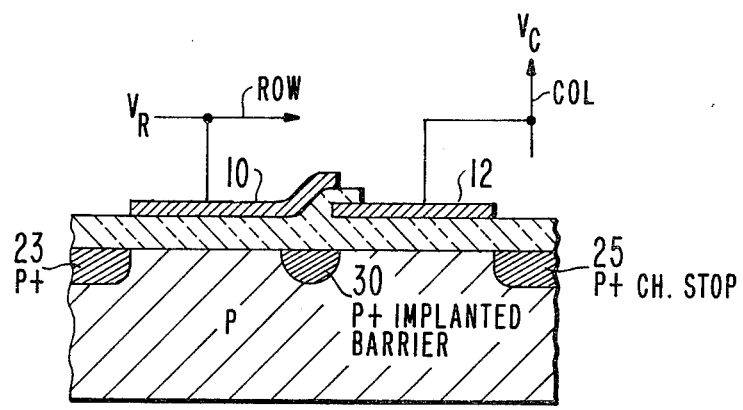
FIGS. 4a–4c are cross-sectional views through three forms of CID's embodying the invention.
Figure 4B:
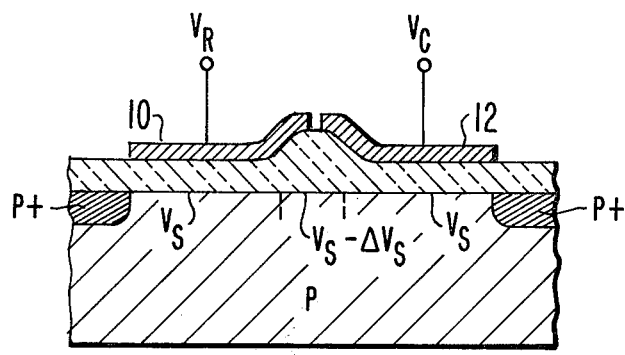
Figure 4C:
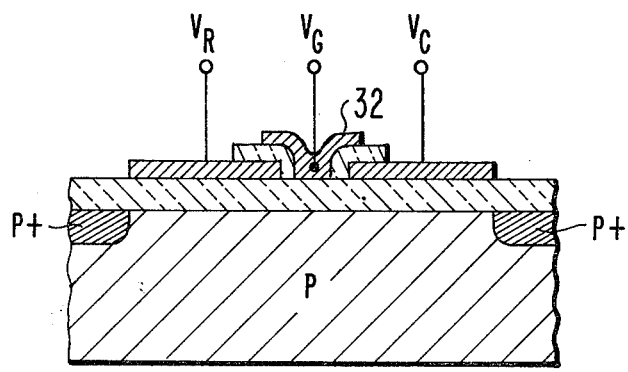

CID's embodying the invention are illustrated in FIGS. 4a-4c. These all differ from the prior art arrangement in that there is present in the substrate region between the two conductors 10 and 12, a potential barrier rather than a potential well. In FIG. 4a the potential barrier is created by an ion implanted region 30 of P+ conductivity type. This region is not as heavily doped as the channel stop regions 23 and 25 and this is indicated schematically by identifying region 30 as a P+' region. In FIG. 4b the barrier is created by spacing the conductors 10 and 12 further from the substrate at their adjacent edges than over the major portion of their extents. Thus, if any voltages of 10 volts are applied to the row and column conductors resulting in surface potentials of say $V_S$ beneath the major portions of conductors 10 and 12, then the surface potential beneath the region between these conductors may be $V_S - \Delta V_S$, as illustrated. The barrier height $V_S - \Delta V_S$ in both cases shown in FIGS. 4a and 4b is dynamic in the sense that the surface potential within the barrier depends upon the potential of the overlying conductors (sometimes termed gates), but it varies to a much lesser extent than the surface potential under the row or column gate varies with gate voltage. Thus, as either $V_c$ or $V_R$ approaches zero potential, the barrier height $V_S - \Delta V_S$ also approaches zero, and the device operates as though the surface potential of the barrier had remained at a relatively constant value throughout the operating cycle.

Although the barrier between row and column wells has been illustrated in FIGS. 4a and 4b as being symmetrically located between the two, it is understood that it may instead be formed primarily under either the row or column gate (close to the adjacent edges of the two gates). So long as the barrier is between the two wells, it is still effective in retaining charge in either well when both gates are at the same potential. If the barrier is entirely beneath one gate, that gate should be made larger than the other gate so that the column and row potential wells remain of the same size. An example of a structure in which the barrier is effectively entirely beneath the column conductors is given in FIGS. 5 and 6, which are discussed later.

The barrier in FIG. 4c is created by a separate gate electrode 32 which is maintained at a fixed potential $V_G$ which is less positive than the column and row voltages $V_c$ and $V_R$. For example, $V_G$ may be 1 or 2 volts and $V_R$ and $V_c$ operated at 10 volts during the integration time. In all of these cases, the parameters are such that the barrier between potential wells during the integration time is only slightly lower, say a volt or less lower, than the potential created by the channel stops.

Figure 7:
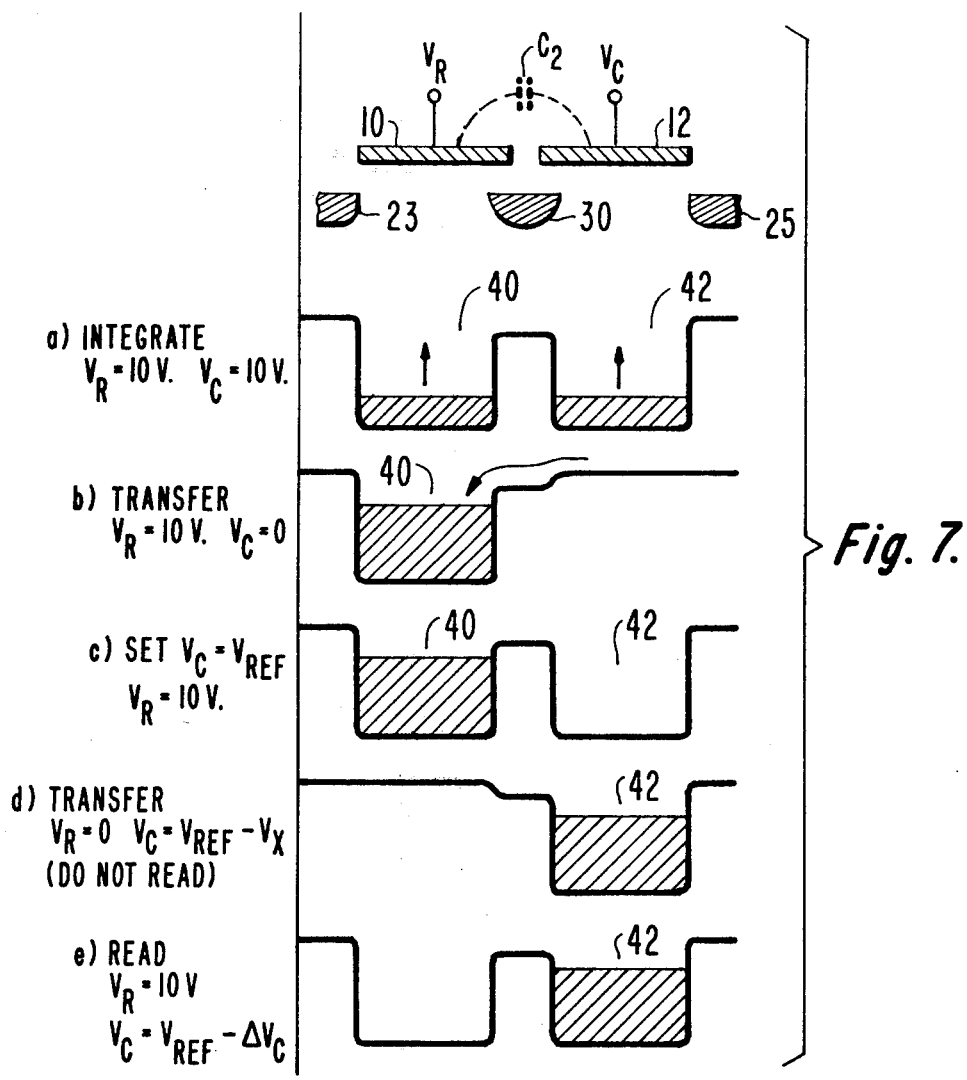
FIG. 7 is a drawing of surface potential profiles to help illustrate the operation of the CID's embodying the invention.

The operation of the arrays of FIGS. 4a–4c is depicted in FIG. 7 using a structure similar to that of FIG. 4a as an example. Initially, both conductors 10 and 12 may be placed at 0 volts to inject any electrons present into the substrate. Then, at the start of the integration time, $V_R$ and $V_c$ are both placed at say 10 volts as illustrated at a in FIG. 7, but only $V_R$ remains at 10 volts while $V_c$ is cycled between this value and ground as illustrated at b in FIG. 7. In response to a light image reaching the substrate beneath conductors 10 and 12, electrons are generated in both wells 40 and 42. At the end of the integration time the charges generated in well 42 have been shifted to well 40 by cyclically changing the column voltage $V_c$ from 10 volts to 0 volts as illustrated at b in FIG. 7. Then the column voltage $V_c$ is set to and allowed to float at a reference level $V_{REF}$ which is determined by the column voltage sensing circuit and may be precisely 10 volts or some other convenient value close to 10 volts. Then the row voltage $V_R$ is changed from 10 volts to 0 volts and this causes the transfer of electrons from well 40 to well 42. This results in a change in the column voltage $V_c$ from $V_{REF}$ to $V_{REF}-V_X$ as shown at d in FIG. 7. While this voltage could be used as the read signal, the present inventor prefers not to do so since such a signal may be affected by capacitive coupling effects between row and column. Instead, after the step above, the row voltage is returned to its original value, that is, it is returned to exactly the same 10 volts as it was previously. The result of this change in voltage is to modify the column voltage a slight amount so that it becomes $V_{REF}-\Delta V_C$ as shown at e in FIG. 7. Recall that the voltage $V_{REF}$ was established in step c when $V_R$ was 10 volts. This value and the value of $C_2$ affect the value of $V_{REF}$. By returning $V_R$ to precisely the same 10 volt level as was present in step c, the effect of $C_2$ and $V_R$ on the reference voltage $V_{REF}$ in step e is precisely the same as it was when $V_{REF}$ was originally established. Therefore $\Delta V_c$ which is read out at step e is not affected by $C_2$ or $V_R$. Even if $C_2$ varies from one location to another, it does not affect $\Delta V_c$ nor does minor variation of $V_R$ from one row to another or from one period to another so long as $V_R$ can be returned in step e to the same level as it was in step c of the same operating period.

Operation in the manner described also has a number of other significant advantages over the operation discussed of the known CID. One is that the relatively constant surface potential created by the implanted barrier 30 or by the other barrier potential producing means of the other embodiments illustrated, serves as an electrostatic shield to reduce the capacitive coupling ($C_1$ of FIG. 1) between the semiconductor insulator interface under the row conductor 10 and the adjacent column conductor 12. This reduction in $C_1$ reduces the undesirable reduction in the $\Delta V_{COL}$ signal coupled through this capacitance which has already been described.

Another advantage is that the charge storage capacity of the present CID is approximately double that of the previous CID, assuming the same voltages, equal area conductors and equal capacitances in the two devices. The reason is that in the present arrangement the voltage swing on the column conductor 12 can be as great as the voltage swing on the row conductor 10, whereas in the prior art the voltage swing on the column conductor cannot be made more than one half that of the row conductor. Accordingly, the maximum useful charge in the present arrangement, that is, $Q_{MAX}$, is equal to substantially the full capacity of a well such as 40, whereas in the prior art, as already explained, the maximum useful charge under the best of circumstances is not more than one half of the capacity of the well under conductor 10.

Figure 5:
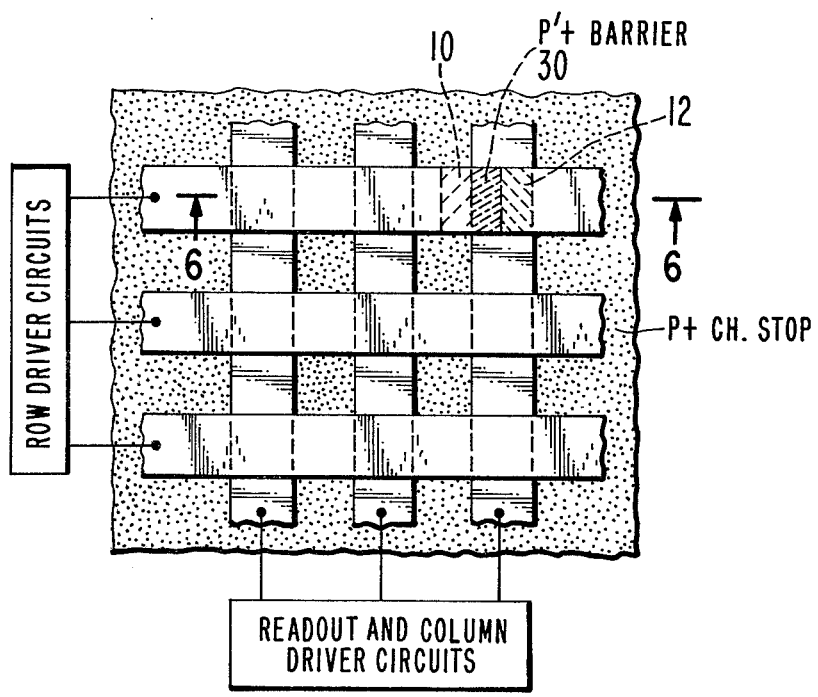
FIG. 5 is a plan and schematic showing of a portion of a CID array embodying the invention.
Figure 6:
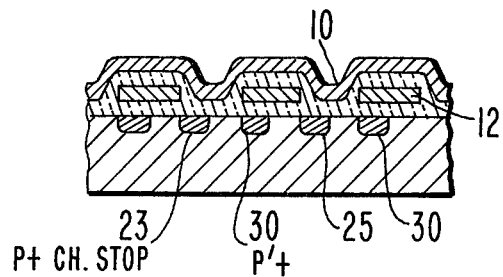
FIG. 6 is a section through one of the CID's of FIG. 5.

FIG. 5 illustrates an array of barrier-type CID's wherein the individual elements are similar to the one shown in FIG. 4a. A number of individual elements of FIG. 5 are shown in the cross section of FIG. 6. As in FIG. 4a, the barrier is created by a P+ region 30; however, here the barrier 30, in effect, is entirely beneath the column conductor which shields it from the row conductor, whereas in FIG. 4a the barrier is overlapped by unshielded edges of both a column and a row conductor. The barrier is doped not quite as heavily as the P+ channel stop regions 23 and 25 so that the barrier created by 30 is slightly lower than the barriers created by the channel stops. The row and column conductors are identified as 10 and 12 so that the correspondence between this figure and FIG. 4a will be clearer. The channel stop regions separate the rows and columns of CID's from one another. One of the locations 10, 30, 12 is shown in dashed cross-hatching in FIG. 5. The channel stop regions surround this and the other locations.

Figure 9:
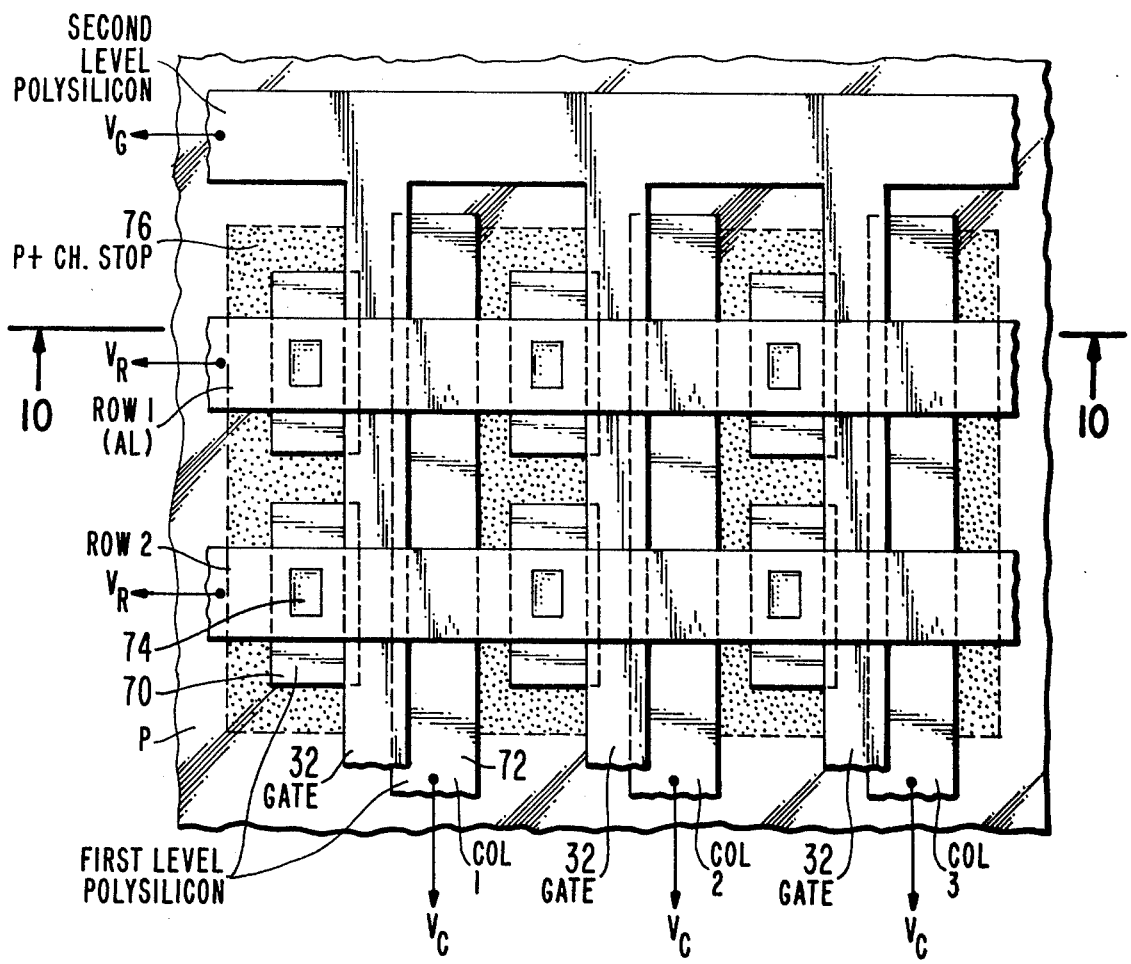
FIG. 9 is a plan view of another CID array embodying the invention.
Figure 10:
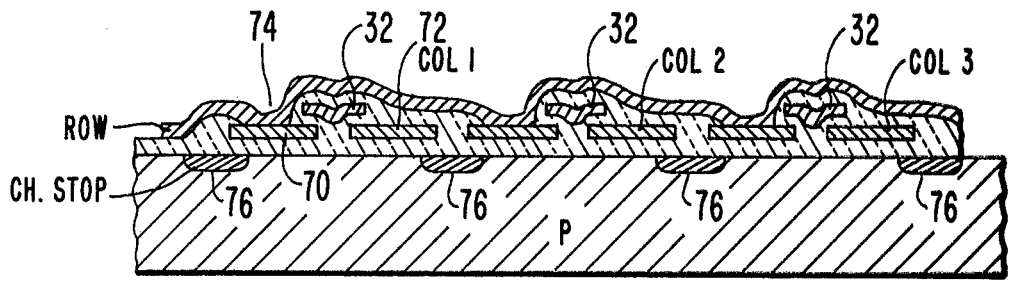
FIG. 10 is a section taken through line 10—10 of FIG. 9.

FIG. 9 illustrates an array of elements which use a gate for forming the potential barrier between adjacent potential wells of each CID and FIG. 10 is a cross section taken along line 10—10 of FIG. 9. Each CID is of the type shown in FIG. 4c. Each CID comprises a first conductor 70 formed of a first level of polysilicon and a second conductor 72 which is part of a column conductor and which also is in the first layer of polysilicon. The first conductor 70 is connected to a row conductor, which may be formed of aluminum, and which is connected to the first conductor via a connection 74. The gate electrode 32 comprises a second level of polysilicon and it is located in the space between adjacent edges of the conductors 70 and 72. Channel stop regions 76 separate the CID's from one another. Some of these regions as well as the other structure described are shown more clearly in the cross section of FIG. 10.

Figure 8:
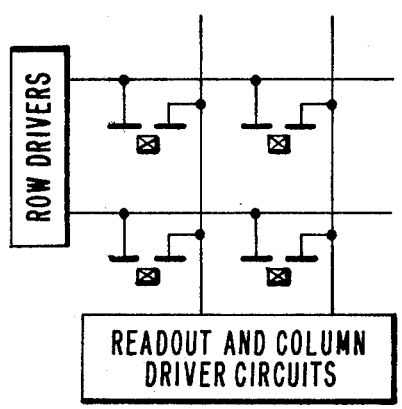
FIG. 8 is a schematic showing of a CID system embodying the invention.

It is to be appreciated that the CID of FIG. 4b is also intended for arrangement in an array and FIG. 8 is intended to be generic to all embodiments of the barrier-type CID's which are illustrated. Each element of the array includes a first conductor connected to or formed of a row lead, a second conductor connected to or formed of a column lead and a means for producing a potential barrier in the substrate region between the two potential wells which are created. The barrier may be produced by the ion implanted region 30 of FIG. 4a, the thick oxide layer of FIG. 4b, or the gate electrode 32 of FIG. 4c, as three examples. The array can be operated in the manner illustrated in FIG. 7. The means for producing the row voltages are standard and are illustrated by the block legended "row drivers." in FIG. 8. The means for driving the column conductors also are standard as are the means for producing the reference voltage level $V_{REF}$ and the means for sensing the change in voltage level on the columns during the read interval. All such means are intended to be represented by the single block legended "readout and column driver circuits". A more detailed showing of elements suitable for use within the blocks may be found in a number of references mentioned herein such as U.S. Pat. No. 4,016,550 above, and in other places in the literature.

While not illustrated, the barrier-type CID's of the present application may be operated in interlaced fashion in a manner similar to that discussed at length in U.S. Pat. No. 4,032,903 for "Charge Injection Device Arrays," issued June 28, 1977 to the present inventor. If the barrier-type CID described in FIG. 5 were to be operated in the interlaced mode of the above patent, it could be modified by eliminating the channel stop between the rows since the intervening rows, when properly driven, can provide the vertical barrier on alternate fields. The operating voltages on the rows could be the same as described in that patent, in which case the "read" step would occur at step (d) in FIG. 7. However, to take full advantage of the barrier structure in eliminating capacitive coupling between rows and columns it would be preferable to modify the row voltage driver to cause it to produce a momentary return of the row voltage to +10V after each transfer of charge to the columns so that "read" could occur as in step (e) of FIG. 7.

It has been stated above that while a P-type substrate is illustrated, the substrate can be N-type instead. It is also to be understood that the substrate can be a thin epitaxial layer of one conductivity type over a thick substrate layer of opposite conductivity type. It is intended that the claims be generic to all of these various possibilities.

What is claimed is:

1. A charge injection device (CID) and a circuit for operating the same comprising:

a semiconductor substrate of given conductivity type;

first and second side-by-side conductors insulated from one another and from the substrate located close to the substrate;

means operative during an integration time for applying a voltage $V_R$ at a given level to said first conductor for producing a first potential well in said substrate beneath said first conductor for the accumulation of charge in response to radiant energy excitation; means operative during said integration time for applying a voltage $V_C$ to said second conductor which can have a value such that a second potential well is produced in the substrate beneath said conductor adjacent to said first potential well, said second potential well for the accumulation of charge in response to radiant energy excitation;

means for creating a potential barrier in said substrate between said potential wells;

means upon the termination of said integration time and while said voltage $V_R$ remains at said given level for operating said second conductor at a value of voltage $V_C$ such that any charge accumulated in said second well passes over said potential barrier and into said first well;

means for then setting and allowing said second conductor to float at a reference level $V_C = V_{REF}$ while said voltage $V_R$ applied to said first conductor is at said given level, both $V_{REF}$ and said given level of $V_R$ being levels such as to produce said first and second potential wells;

means operative while $V_C = V_{REF}$ for then reducing the value of the voltage $V_R$ on said first conductor to a second level such that all the charge present in said first well passes over said barrier to said second well;

means for returning the voltage $V_R$ on said first conductor to said given level while the charge present in said second well remains in said second well; and means for then measuring the value of the voltage present on said second conductor.

2. The invention as claimed in claim 1, wherein said means for creating a potential barrier comprises a region in the substrate between the two potential wells which is of the same conductivity type as the substrate but which is more highly doped than the substrate.

3. The invention as claimed in claim 1, wherein said means for creating a potential barrier comprises a gate electrode which is insulated from said conductors and from said substrate and which is located over the substrate in the space between said electrodes.

4. The invention as claimed in claim 1, wherein said means for creating a potential barrier comprises the spacing of said conductors substantially further from the substrate at th edge portions thereof which are closest to one another than over the portions of the conductors which create the potential wells in response to the voltages applied to the conductors.

5. The invention as claimed in claim 1, wherein the means for applying voltages comprises means for applying a voltage $V_R$ to said first conductor and a voltage $V_c$ to said second conductor, where $V_R$ is approximately equal to $V_c$ so that the first and second wells are of approximately the same depth.

6. The invention as claimed in claim 1, wherein said means for applying a voltage $V_C$ comprises means operative during said integration time for applying a voltage which cyclically changes between a level at which said second potential well forms to a level at which any charge present in said second well passes over said barrier and into said first well.

7. The invention as claimed in claim 1, wherein said means for creating a potential barrier comprises means for creating a potential barrier which remains of substantially constant height during the operation of said CID, in said substrate between said first and second potential wells.

8. An array of charge injection devices (CID's) arranged in columns and rows and means for operating the same, said array including a common semiconductor substrate of given conductivity type, said substrate including regions which separate the columns of the array from one another by potential barriers in the substrate between columns of the CID's each CID in said array comprising:

a first conductor insulated from the substrate;

a second conductor adjacent to the first conductor and insulated therefrom and from the substrate;

means for creating a potential barrier in a region of the substrate adjacent to the adjacent edges of the first and second conductors at a level only slightly lower than the potential barriers separating the columns of CID's from one another; and said means for operating a selected one of said CID's comprising:

means for placing the first and second conductors of said selected CID at potentials such that charge carriers present in that CID are injected into the substrate;

means, during an integration time, for placing the first and second conductors of the selected CID at potentials $V_R$ and $V_C$, respectively, $V_R$ being at a constant first level such that a first potential well forms in the substrate, and $V_C$ varying in value between a first level at which a second potential well forms in the substrate which is separated by a potential barrier from said first potential well and a second level at which any charge present in said second potential well is shifted over said barrier and into said first potential well, said first and second wells for the accumulation of charge in response to radiant energy excitation;

means during the time the voltage $V_R$ applied to said first conductor of the selected CID is at said constant first level and after said second potential well is empty of charge for establishing the voltage $V_C$ on the second conductor of the selected CID at a fixed reference level $V_{REF}$ such that said second potential well is present in the substrate and for allowing said second conductor to float at said reference level $V_{REF}$;

means for then lowering the potential of the first conductor of the selected CID for transferring the charge from the first potential well to the second potential well of said selected CID;

means for then returning the potential $V_R$ of the first conductor of the selected CID to said first level which was present when the voltage $V_{REF}$ was established on the second conductor of said CID; and means for then sensing the voltage present on the second conductor of said selected CID.

9. An array as set forth in claim 8, wherein said means in each CID for creating a potential barrier in the region of the substrate adjacent to adjacent edges of the first and second conductors comprises a substrate region of the same conductivity type as the substrate but more highly doped than the substrate.

10. An array as set forth in claim 8, wherein the means in each CID for creating a potential barrier in the region of the substrate adjacent to adjacent edges of the first and second conductors comprises a gate electrode insulated from the first and second conductors and from the substrate located in the space between adjacent edges of the first and second conductors, and means for applying a potential to said gate electrodes.

11. An array as set forth in claim 8, wherein the means in each CID for creating a potential barrier in the region of the substrate adjacent to adjacent edges of the first and second conductors comprises insulation adjacent to adjacent edge of the first and second conductors spacing these edges substantially further from the substrate than the remainder of the first and second conductors of that CID.

12. An array as set forth in claim 8, wherein said means for operating said array comprises means for selecting a row of CID's at a time.

13. An array as set forth in claim 8, wherein said barrier is entirely within the edge of one of the first and second conductors and is outside of the edge of the other of said conductors.

* * * * *

UNITED STATES PATENT AND TRADEMARK OFFICE
CERTIFICATE OF CORRECTION

PATENT NO. : 4,134,031

DATED : January 9, 1979

INVENTOR(S) : Paul Kessler Weimer

It is certified that error appears in the above-identified patent and that said Letters Patent is hereby corrected as shown below:

Column 7, line 48, the word "means" should be the start of a new paragraph.

Column 7, line 52, after "said" (first occurrence) insert --second--.

*Signed and Sealed this*

*Twenty-fourth* Day of *April 1979*

[SEAL]

Attest:

RUTH C. MASON
*Attesting Officer*

DONALD W. BANNER
*Commissioner of Patents and Trademarks*